United States Patent [19]

Gergis

[11] E Re. 30,732

[45] Reissued Sep. 1, 1981

[54] CONSECUTIVE BIT ACCESS OF MAGNETIC BUBBLE DOMAIN MEMORY DEVICES

[76] Inventor: Isoris S. Gergis, 5892 Lynnbrook Plz., Yorba Linda, Calif. 92686

[21] Appl. No.: 60,690

[22] Filed: Jul. 25, 1979

Related U.S. Patent Documents

Reissue of:

[64] Patent No.: 4,075,611
Issued: Feb. 21, 1978
Appl. No.: 633,306
Filed: Nov. 19, 1975

[51] Int. Cl.[3] ..... G11C 19/08

[52] U.S. Cl. ..... 365/15; 365/8; 365/12

[58] Field of Search ..... 365/15, 8, 12

[56] References Cited

U.S. PATENT DOCUMENTS

| | | | |
|---|---|---|---|
| 3,838,407 | 9/1974 | Juliussen | 365/15 |
| 4,024,517 | 5/1977 | Chen | 365/15 |

OTHER PUBLICATIONS

American Institute of Physics Conference Proceedings-No. 29, Dec. 9-12, 1975, pp. 51-53.

*Primary Examiner*—James W. Moffitt
*Attorney, Agent, or Firm*—Arnold, White & Durkee

[57] ABSTRACT

A magnetic bubble domain chip layout or organization which achieves consecutive bit access is provided by arranging the device in two substantially identical halves or parts. Each half contains half of the total number of storage loops, a separate access loop with its own generator, switches between the storage loop and an access loop, and a separate detector. The separate detectors are connected together to form two arms of a single bridge wherein consecutive bit output is achieved. The generators in each half of the device are located at different distances from the switches between the loops in one half of the device and the associated access loop. In addition, each of the detectors is located a different distance from the switches in the respective halves or parts of the device.

22 Claims, 1 Drawing Figure

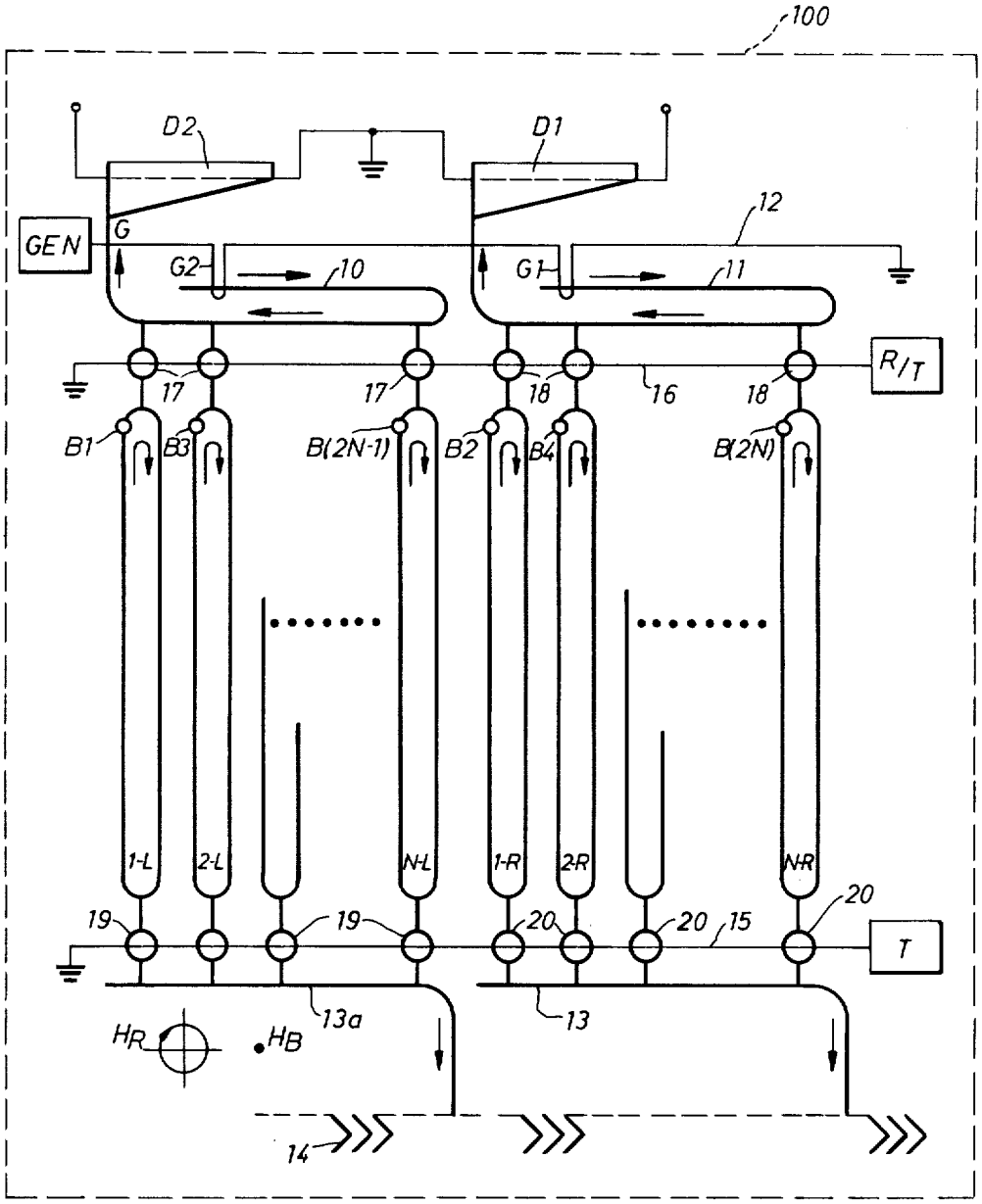
100
D2
D1
12
GEN
G
G2
10
G1
11
R/T
17
17
18
16
18
B1
B3
B(2N-1)
B2
B4
B(2N)
1-L
2-L
N-L
1-R
2-R
N-R
19
19
20
20
15
20
T
13a
13
HR
HB
14

CONSECUTIVE BIT ACCESS OF MAGNETIC BUBBLE DOMAIN MEMORY DEVICES

Matter enclosed in heavy brackets [ ] appears in the original patent but forms no part of this reissue specification; matter printed in italics indicates the additions made by reissue.

BACKGROUND

1. Field of the Invention

This invention relates to magnetic bubble domain devices. In particular, this invention relates to a magnetic bubble domain memory device wherein consecutive bit access is achieved without degradation of margin or other operating characteristics.

2. Description of Prior Art

Fast access bubble memory devices which incorporate switching of bubbles between storage tracks and an access track are usually operated with alternate bit access in which the writing and reading of bubbles occurs every second cycle of the field rotation. Generally, these devices are not operated with consecutive bit access due to the fact that switching and detection margins (bias, phase and amplitude) are degraded considerably as compared to alternate bit access. An example of this situation is the dollar sign switch which is usually used in the major-minor loop organization. With the minor loops located two periods apart relative to the major loop, consecutive bit access can be achieved by switching two bits from each minor loop to the major loop. The switching is performed during two consecutive field cycles by applying two current pulses with the appropriate phase and amplitude to the control conductor of the dollar sign switch. The second pulse, however, interferes with the bubble transferred out by the first pulse and causes this bubble to collapse at the upper bias range of the device operating margin. Phase and amplitude margins of the transfer pulses also become severely limited for successful operation with the consecutive bit access.

Another aspect of device function degradation in consecutive bit access, namely detection, is due to the fact that the stretching of the bubble strip in the detector is hindered at the higher bias range of the operating device margin due to mutual repulsion between adjacent bubble strips. The incomplete or unsuccessful stretching of bubble strips causes a loss of signal and, hence, faulty reading of the data. In addition, the signals of consecutive bits tend to interfere with one another causing a lower output than for alternate bits.

SUMMARY OF THE INVENTION

This invention describes a new organization of a magnetic bubble domain chip layout to achieve consecutive bit access without sacrificing performance of the device. Basically, the device is divided into two parts which are substantially identical. Each of the parts has a plurality of storage loops. In addition, each of the parts has an access loop which is coupled to the storage loops in the respective part by a plurality of replicator/-transfer switches. Separate detectors are connected to each of the access loops to detect information. Each of the access loops includes a separate generator. Each of the generators is spaced from the switches in the respective access loops by a different distance whereby [the information in only one of the access loops is transferred into associated storage loops at a time. Information in the other access loop is transferred into the associated storage loops at a different time.] *alternate bubbles are stored in opposite halves of the device.*

BRIEF DESCRIPTION OF A PREFERRED EMBODIMENT

Referring to the sole FIGURE in the application, there is shown a magnetic bubble domain memory device formed on layer 100 of suitable magnetic bubble domain material. Any such material whether crystalline or amorphous, of which there are many known in the art, may be used in this application. The magnetic memory device comprises a plurality of storage loops 1-L through N-L as well as 1-R through N-R. The total number of loops involved may be any desired number with a minimum of two loops, one having a suffix L and the other having a suffix R. The suffix, in this description, refers to the left or right side of the memory as shown.

Each of the storage loops comprises a suitable propagation path or track formed of any appropriate propagation path devices which are known in the art. That is, the propagation paths may comprise suitable bubble domain device structures such as chevrons, T-bars, H-bars, I-bars or the like as well as combinations thereof.

Each of the storage loops is coupled to a transfer switch 19 or 20 and to a transfer/replicate switch 17 or 18. The transfer switches 19 or 20 and the transfer/replicate switches 17 or 18 are well known in the art. Typical of such switches are those referred to as "pickax" switches or any other active transfer/replicate switches known in the art. Transfer switches 19 or 20 are coupled to erase loops [12 and 13] *13 and 13a*, respectively. Erase loops [12 and 13] *13 and 13a* are directed to any suitable dump such as guardrail 14. Inclusion of guardrail 14 is not essential but provides an improved arrangement. Transfer switches 19 and 20 are linked to a common conductor 15 (if necessary) which is connected to receive a transfer signal T from the appropriate signal source.

Transfer/replicate switches 17 and 18 are coupled to access loops 10 and 11, respectively. Transfer loop 11 includes a suitable generator G1 of any suitable configuration and represented by a conductor loop. A similar generator, G2, is associated with access loop 10. The conductor loops of generators G1 and G2 are preferably, but not necessarily, connected in series with each other and arranged to receive the signal, G, from the appropriate source GEN wherein signals may be generated in a known fashion.

The ends of access loops 10 and 11 are connected to detectors D2 and D1, respectively. Detectors D2 and D1, shown schematically, can be any suitable type of stretcher detector many of which are known in the art. Detectors D1 and D2 are preferably, but not necessarily, connected together in a common bridge network wherein the full data output of the memory device is retrieved.

In the particular invention described herein, it is important that the arrangements between the respective generators and detectors be provided. It is clear that the generator on one side of the device, e.g. generator G2, is located one period closer to the associated switches 17 than the other generator, i.e. G1, is to the associated switches 18. In addition, the detector on the first mentioned side, in this case detector D2, is one period further away from the associated switches, i.e. switches 17, than the detector on the other side, viz. detector D1 relative to switches 18.

The basic operation of the invention follows standard routines. For example, it is initially assumed that the memory device is clear. In order to generate a bubble, the magnetic fields $H_B$ and $H_R$ are applied in the appropriate directions. A signal is applied by source GEN to conductor 12. This signal, when applied at the appropriate time, causes a bubble to be established in each of the access loops 10 and 11 as a result of operations at generators G1 and G2. Under the influence of the applied fields, the bubbles propagate along access loops 10 and 11 in a typical fashion. In order to store the [bubble] *bubbles* in the appropriate storage loops, a signal is supplied to line 16 by source R/T which activates the replicate/transfer switches 18 and 17. One of the bubbles is, thus, transferred into the appropriate storage loop. The second bubble propagates through the access loop and out of the device active area through the guardrail detector. In this fashion, a number of data bits equal to 2N when written in both the access loops 10 and 11 will be transferred into the storage loops—one bit each. Thus, the first bit is transferred to storage loop 1-L, the second bit is transferred into loop 1-R, the third bit is in loop 2-L, and so on. To read the data stored in the storage loops, the bubbles are allowed to propagate around the storage loops under the influence of the applied magnetic fields. At the appropriate time, the proper signal is supplied by source R/T to conductor 16 to render switches 17 and 18 operative to replicate bubbles from the storage loops to the respective access loops 10 or 11, thence, to detectors D1 and D2, respectively. In addition, with the application of the appropriate signal from source T to conductor 15, transfer switches 19 and 20 are activated wherein the contents of the storage loops are transferred to erase loops [12 and 13] *13 and 13a* and propagated to guardrail 14 wherein the bubbles are dissipated.

However, due to the specific arrangement of the generators and detectors relative to the switches, improved operation of the device is achieved. Inasmuch as the generator conductor loops are connected in series, each of the generators is operated concurrently. However, inasmuch as an additional operating period is inserted into the propagation path represented by access loop 11, the bubbles generated by generators G1 and G2 arrive at the associated storage loops at different times. Thus, in the illustrative configuration noted above, the same bubble stream (data) is concurrently generated by generators G1 and G2 in access loops 11 and 10, respectively, in response to a signal from source GEN. However, because of the difference in distance between the generators and the respective switches, the bubble in access loop 10 reaches switch 17 associated with loop 1-L one period before the same bubble on loop 11 reaches switch 18 associated with loop 1-R. Consequently, in response to the signal from source R/T, the bubble B1 is stored in loop 1-L. Of course, the bubble in access loop 11 is not in position to be transferred into any storage loop inasmuch as it is between switches 18 for loops 1-R and 2-R, respectively.

Similarly, the second signal supplied by source GEN causes bubbles to be generated by generators G2 and G1, respectively. These bubbles are propagated through the access loops 10 and 11 in typical fashion. Of course, the second bubble (B2) is one period behind the first bubble (B1). Consequently, in response to the appropriate fields, bubble B2 is stored in storage loop 1-R in response to a signal from source R/T but has already propagated past switch 17 of loop 1-L and is not stored therein.

As is apparent from a continuing type of operation, alternate bubbles are stored in opposite halves of the memory device. That is, the bubble system is arranged with continuous bubbles being applied by generators G1 and G2. Consequently, the odd numbered bubbles are stored in the left portion of the memory device shown in FIG. 1 while the even numbered bubbles are stored in the right portion thereof. Bubble B1 is stored in loop 1-L, bubble B3 is stored in loop 2-L and bubble 2N-1 is stored in loop N-L. Likewise, bubbles B2, B4 and B(2N) are stored in loops 1-R, 2-R and N-R, respectively.

By appropriately choosing the length of the access loop with regard to the length of the storage loop, the bubbles B1, B3 and B(2N-1) are replicated out of the storage loops onto access loop 10 by the respective switches 17 at substantially the same time. Likewise, alternate bubbles B2, B4 and B(2N) are also replicated out of the appropriate storage loops onto access path 11 at the same time.

The information thus transferred to loops 10 and 11 is propagated through the respective loops in response to the applied fields. Inasmuch as detector D2 is one period [closer to] *further away from* switches 17 than is detector D1 relative to switches 18, bubbles B1, B3 and so forth are received at detector D2 at one period while bubble B2 is received at detector D1 in the next period. Likewise, bubble B3 is then received at detector D2 in the next period followed by bubble B4 which is received at detector D1 in the fourth period. This operation continues wherein the odd bubbles are detected at detector D2 while the even number bubbles are detected at detector D1. Inasmuch as each detector receives a bubble during every other cycle, complete bubble strip stretching can be achieved over a wider operating bias margin wherein improved operation is achieved. In addition, the data stream applied by the generator apparatus is fully reconstructed by the split detectors.

It is clear that no extra electronic components are required for driving the subject device especially inasmuch as all functions (e.g. switching, generation and the like) are performed simultaneously on both sides of the chip. This removes the requirement for complex multiplexing or multiplexing of two separate chips with separate functional drivers and the like. In addition, essentially twice the data rate is achieved as compared to known organizations without sacrificing device performance inasmuch as switching is accomplished using a single operation rather than consecutive operations.

Thus, there has been shown and described a preferred embodiment of a new bubble domain memory device chip organization. This organization permits consecutive bit access without sacrificing the performance of the device. It may be apparent to others skilled in the art that modifications in this device may be made to achieve results which are related in nature. However, any modifications which fall within the description herein are intended to be included herein as well. The particular embodiment shown and described is illustrative only and is not intended to be limitative of the invention. Rather, the invention is limited only by the scope of the claims appended hereto.

Having thus described a preferred embodiment of the invention, what is claimed is:

1. In combination, first and second generator means capable of operating concurrently to produce information bits, first and second storage means, first and second separate access paths for coupling said first and second generator means to said first and second storage means, respectively, said first access path defining a first access distance between said first generator means and the associated first storage means, said second access path defining a second access distance between said second generator means and the associated second storage means, said first and second access distances having a prescribed first difference whereby said first storage means can receive information only from said first generator means and said second storage means can receive information only from said second generator means via the respective first and second access paths, first and second detector means, first and second separate coupling means, said first coupling means defining a first coupling distance between said first storage means and said first detector means, and said second coupling means defining a second coupling distance between said second storage means and said second detector means, said first and second coupling distances having a prescribed second difference which is related to said prescribed first difference whereby said first detector can receive information only from said first storage means and said second detector means can receive information only from said second storage means via the respective first and second coupling means.

2. The combination recited in claim 1 wherein said first and second storage means each comprise a plurality of individual storage [areas] *loops*, each of the respective stoage [areas] *loops* in each of said storage means coupled to the respective first and second access paths.

3. The combination recited in claim 1 wherein each *of* said generator means, each *of* said storage means, each *of* said access path, each *of* said detector means, and each *of* said coupling means comprises patterns of magnetizable material disposed upon a magnetic bubble domain material.

4. The combination recited in claim 1 wherein said first and second generator means include conductor loops connected in series, and means for driving said conductor loops.

5. The combination recited in claim 1 including connecting means for connecting said first and second detector means together in a common network.

6. The combination recited in claim 1 including erase means coupled to said first and second storage means whereby the information stored in each said storage means may be selectively erased.

7. The combination recited in claim 6 wherein said erase means includes propagation path means, switching means coupled between said propagation path means and said first and second storage means to selectively transfer information from said first and second storage means to said propagation path means.

8. The combination recited in claim 1 wherein said prescribed first difference between first and second access distances is one period whereby alternate information bits generated by said first and second generator means are stored in said first and second storage means respectively.

9. The combination recited in claim 8 wherein said first and second coupling distances differ by one period whereby information from said first and second storage means can be combined at said first and second detector means to produce complete detection of all information generated by said first and second generator means.

10. The combination recited in claim 1 including switching means arranged between each of said access paths and the associated storage means.

11. The combination recited in claim 10 wherein said switching means is further arranged between said storage means and the associated coupling means.

12. The combination recited in claim 11 wherein said first and second access paths are coupled to said first and second coupling means.

13. The combination recited in claim 10 wherein said switching means comprises at least one transfer/-replicate switch, and control signal means for controlling the operation of each said transfer/replicate switch.

*14. In a magnetic bubble memory device having a magnetic film for supporting magnetic bubbles, including generator means for creating magnetic bubbles in said film, and detector means for sensing said magnetic bubbles,*

*the improvement which comprises a first and second storage area located on said film with said first storage area a different number of bubble periods from said detector means than said second storage area, so that bubbles from said first storage area arrive at said detector means at a different cycle of rotation than bubbles from said second storage area, enabling consecutive bit reading of said magnetic bubbles.*

*15. A magnetic bubble memory device as set forth in claim 14 wherein the difference between the distances of said first storage area and said detector and said second storage area and said detector is equal to one bubble period.*

*16. In a magnetic bubble memory device having a magnetic film for supporting magnetic bubbles, including generator means for providing magnetic bubbles in said film, and detector means for sensing said magnetic bubbles,*

*the improvement which comprises first and second storage areas located on said film with said first storage area located a different number of bubble periods from said generator means and said detector means than said second storage area, thereby enabling consecutive bit reading and writing of said magnetic bubbles.*

*17. A magnetic bubble memory device as set forth in claim 16 wherein said difference in distances between said first storage area and said generator, and said second storage and said generator, and said first storage area and said detector and said second storage area and said detector is equal to one bubble period.*

*18. A magnetic bubble memory device comprising a magnetic film for supporting magnetic bubbles representative of information bits including:*

*generator means for creating magnetic bubbles;*

*first and second storage areas, located in adjacent relationship to one another, for storing said magnetic bubbles; and,*

*detector means for sensing said magnetic bubbles, wherein said first storage area is a different number of bubble periods from said generator and said detector than said second storage area, enabling said magnetic bubbles to be read from and written to said first and second storage areas in a consecutive bit fashion.*

*19. A magnetic bubble memory device as set forth in claim 18 wherein said difference in distances between said first storage area and said generator, and said second storage and said generator, and said first storage area and said detector and said second storage area and said detector is equal to one bubble period.*

*20. A magnetic bubble memory device comprising:*

*at least one generator for providing magnetic bubbles representative of information bits;*

*first and second storage areas for storing said magnetic bubbles,*

*at least one generator access path located between said at least one generator and said first and second storage areas for temporarily storing said magnetic bubbles and providing a delivery path from said at least one generator to said first and second storage areas;*

*at least one detector for sensing said magnetic bubbles, wherein said first storage area is a different number of bubble periods from said detector than said second storage area, so that one of said first and second storage areas is closer in proximity to said detector than the other, enabling consecutive bit access;*

*at least one detector access path located between said detector and said first and second storage areas for providing a delivery path from said at least one detector and said first and second storage areas; and,*

*transfer means for moving magnetic bubbles from said first and second storage areas to said at least one detector, and to said first and second storage areas from said at least one generator.*

*21. A magnetic bubble memory device as set forth in claim 20 wherein said transfer means comprises a transfer/replicate switch.*

*22. A magnetic bubble memory device as set forth in claim 20 wherein the difference between the distances of said first storage area and said detector and said second storage area and said detector is equal to one bubble period.*

* * * * *